United States Patent
Kachi

(10) Patent No.: US 11,715,773 B2
(45) Date of Patent: Aug. 1, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tsuyoshi Kachi, Kanazawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 133 days.

(21) Appl. No.: 17/471,367

(22) Filed: Sep. 10, 2021

(65) Prior Publication Data

US 2022/0302266 A1    Sep. 22, 2022

(30) Foreign Application Priority Data

Mar. 17, 2021   (JP) .................. 2021-043658

(51) Int. Cl.
*H01L 29/40* (2006.01)
*H01L 29/06* (2006.01)
*H01L 29/78* (2006.01)

(52) U.S. Cl.
CPC ........ *H01L 29/407* (2013.01); *H01L 29/0611* (2013.01); *H01L 29/7802* (2013.01)

(58) Field of Classification Search
CPC ............. H01L 29/7802; H01L 29/7813; H01L 29/4236; H01L 29/0611; H01L 29/0649; H01L 29/42368; H01L 29/407; H01L 29/66734

See application file for complete search history.

(56) References Cited

U.S. PATENT DOCUMENTS

| | | | |
|---|---|---|---|
| 6,956,264 B2 | 10/2005 | Hijzen et al. | |
| 9,461,154 B2 | 10/2016 | Ogawa | |
| 10,453,930 B2 | 10/2019 | Nishiguchi | |
| 2014/0084333 A1* | 3/2014 | Nakamura | H01L 29/7397 257/139 |
| 2014/0284773 A1* | 9/2014 | Nishiguchi | H01L 29/402 438/597 |

(Continued)

FOREIGN PATENT DOCUMENTS

| | | |
|---|---|---|
| JP | 2005-512342 A | 4/2005 |
| JP | WO 2015/019862 A1 | 2/2015 |

(Continued)

*Primary Examiner* — Shahed Ahmed
*Assistant Examiner* — Khatib A Rahman
(74) *Attorney, Agent, or Firm* — Allen & Overy LLP

(57) ABSTRACT

A semiconductor device includes first to fourth electrodes, a semiconductor portion, and first and second insulating films. The semiconductor portion includes first to third semiconductor layers. The second electrode is in contact with the third semiconductor layer and is spaced from the second semiconductor layer, the third semiconductor layer, and the second electrode. The first insulating film covers the third electrode. The fourth electrode is connected to the second electrode, and is spaced from the first semiconductor layer and the third electrode. The second insulating film is provided on a side surface of the fourth electrode, faces the first semiconductor layer through an air gap, and increases in thickness toward the first direction.

8 Claims, 8 Drawing Sheets

(56) References Cited

U.S. PATENT DOCUMENTS

| | | | |
|---|---|---|---|
| 2015/0179764 A1* | 6/2015 | Okumura | H01L 29/66 |
| | | | 438/270 |
| 2016/0093719 A1* | 3/2016 | Kobayashi | H01L 21/28008 |
| | | | 438/270 |
| 2017/0263767 A1 | 9/2017 | Nishiwaki | |
| 2018/0083110 A1* | 3/2018 | Kobayashi | H01L 29/41 |
| 2019/0081173 A1* | 3/2019 | Nishiwaki | H01L 29/7811 |
| 2019/0296147 A1* | 9/2019 | Kawamura | H01L 29/66734 |
| 2020/0058778 A1* | 2/2020 | Fukunaga | H01L 29/407 |

FOREIGN PATENT DOCUMENTS

| | | |
|---|---|---|
| JP | 2017-162909 A | 9/2017 |
| JP | 2018-182258 A | 11/2018 |

\* cited by examiner

SEMICONDUCTOR DEVICE

CROSS-REFERENCE TO RELATED APPLICATIONS

This application is based upon and claims the benefit of priority from Japanese Patent Application No. 2021-043658, filed on Mar. 17, 2021; the entire contents of which are incorporated herein by reference.

FIELD

Embodiments relate to a semiconductor device.

BACKGROUND

For example, there are vertical power semiconductors having a trench structure to achieve fine cells and reduce on-resistance. In addition, there is known a technique of providing a field plate electrode in a drift layer by a trench structure to improve a breakdown voltage at the time of turning off.

DETAILED DESCRIPTION

Figure 1:
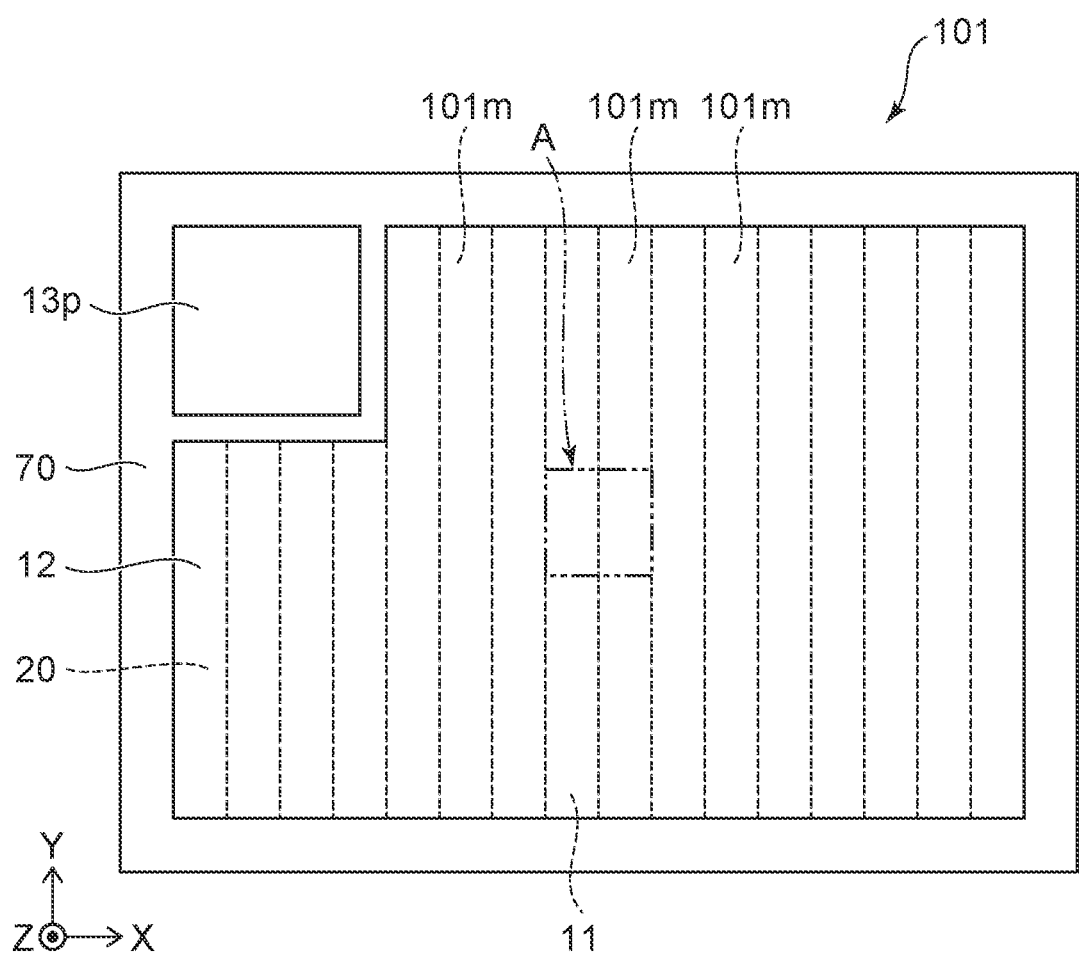
FIG. 1 is a plan view showing a semiconductor device according to a first embodiment.

A semiconductor device according an embodiment includes a first electrode, a semiconductor portion, a second electrode, a third electrode, a first insulating film, a fourth electrode, and a second insulating film. The semiconductor portion is provided on the first electrode. The semiconductor portion includes a first semiconductor layer, a second semiconductor layer, and a third semiconductor layer. The first semiconductor layer is a first conductivity type and is provided on the first electrode. The second semiconductor layer is a second conductivity type and is provided on a portion of the first semiconductor layer. The third semiconductor layer is a first conductivity type and is provided on at least a portion of the second semiconductor layer. The second electrode is in contact with the third semiconductor layer. The third electrode is spaced from the second semiconductor layer, the third semiconductor layer, and the second electrode. The first insulating film covers the third electrode and is in contact with the second semiconductor layer and the third semiconductor layer. The fourth electrode extends in a first direction from the first electrode toward the second electrode. The fourth electrode is connected to the second electrode, and is spaced from the first semiconductor layer and the third electrode. The second insulating film is provided on a side surface of the fourth electrode, and faces the first semiconductor layer through an air gap. The second insulating film increases in thickness toward the first direction.

Hereinafter, embodiments will be described with reference to the drawings.

It is noted that the drawings are schematic, and the relationship between the thicknesses and widths of respective portions, the ratio of the sizes between the portions, and the like are not necessarily the same as the actual ones. In addition, even in a case where the same portions are represented, the dimensions and the ratios of the respective portions may be represented differently depending on the drawings. Furthermore, in the specification and the drawings, the same elements as those described with respect to the already described drawings are denoted by the same reference numerals, and detailed description of the elements will be omitted as appropriate.

First Embodiment

Figure 2:
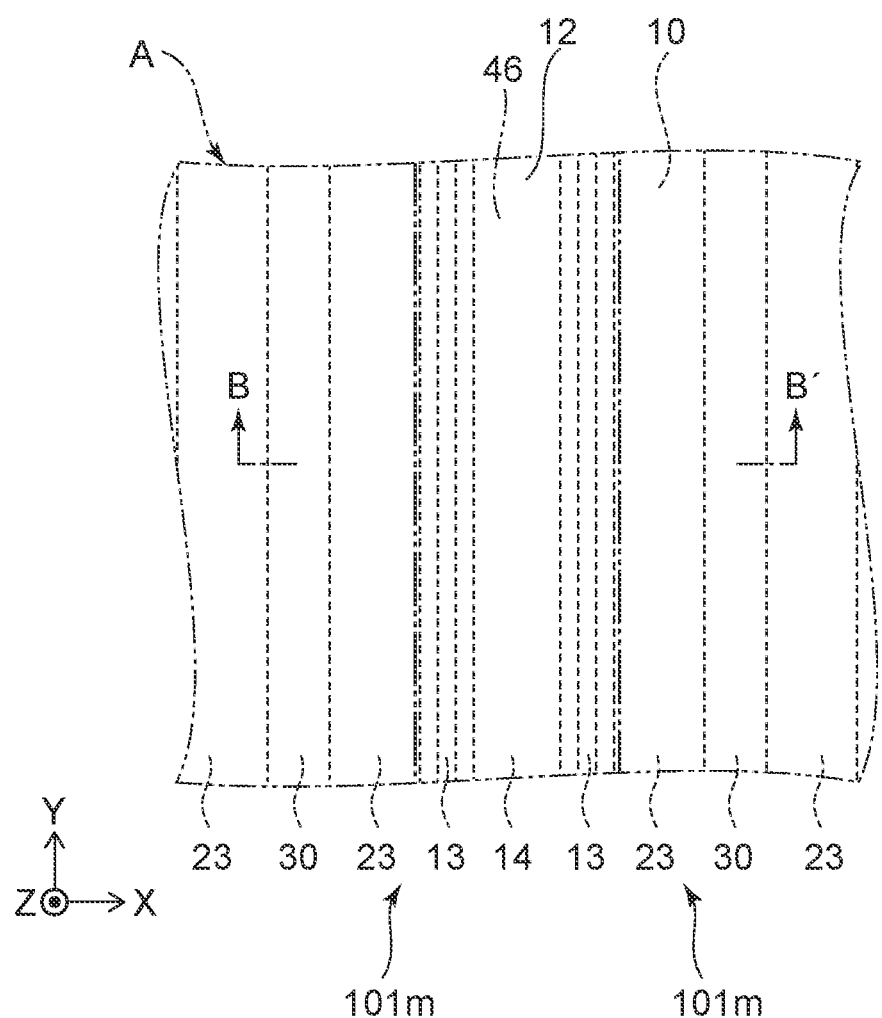
FIG. 2 is an enlarged plan view showing a region A of FIG. 1.
Figure 3:
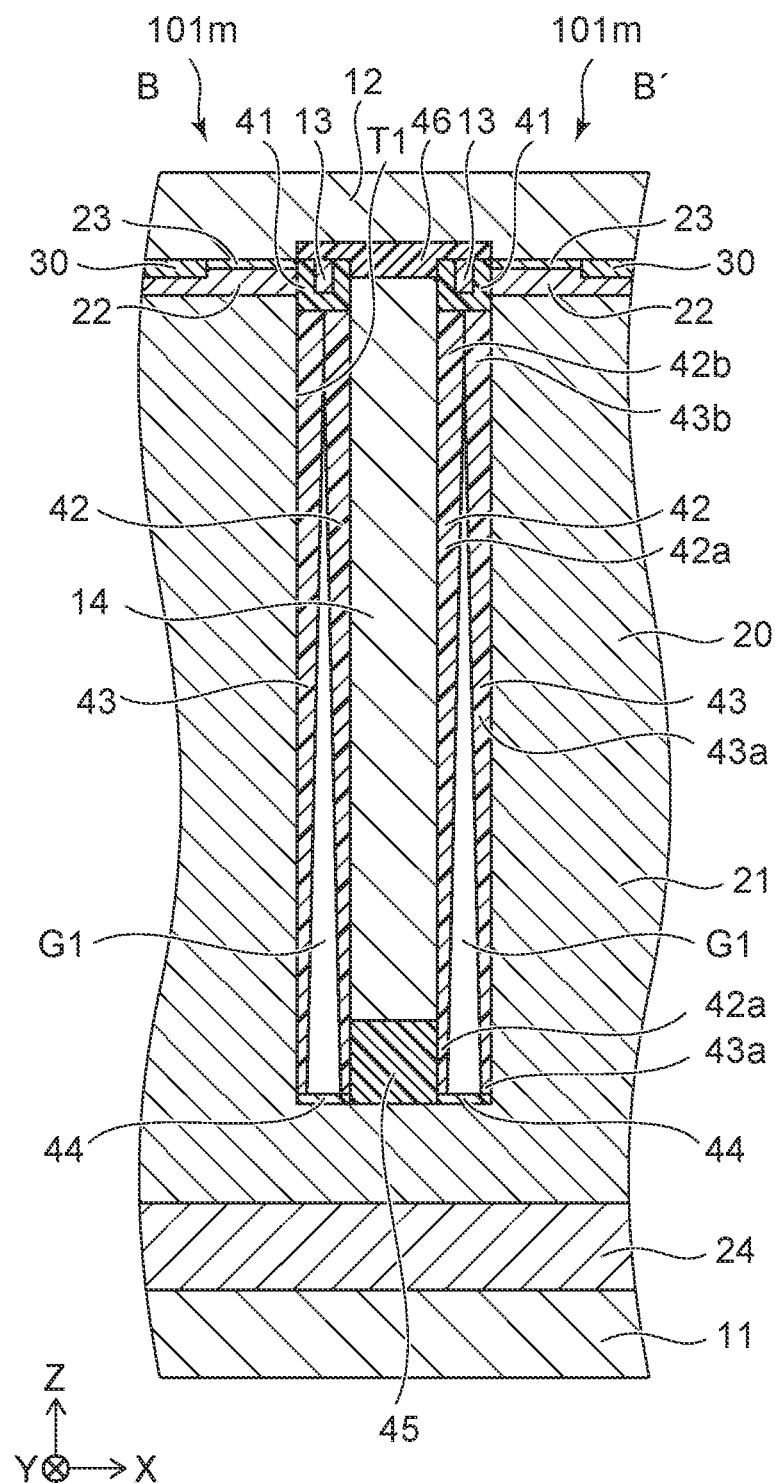
FIG. 3 is a cross-sectional view taken along line B-B' shown in FIG. 2.

FIG. 1 is a plan view showing a semiconductor device according to the embodiment. FIG. 2 is an enlarged plan view showing a region A of FIG. 1. FIG. 3 is a cross-sectional view taken along line B-B' shown in FIG. 2. In FIG. 1 to FIG. 3, a protective film and an interconnection layer are omitted. For visibility, in FIG. 2, only an inter-electrode insulating film 46 described later is shown by a two-dot dashed line.

A semiconductor device 101 according to the embodiment is a power semiconductor device used for controlling a current, to which a voltage of, for example, 320 V or less is applied. The semiconductor device 101 includes multiple metal-oxide-semiconductor field-effect transistors (MOSFETs). As shown in FIG. 1 and FIG. 2, multiple MOSFETs 101m are arranged in the semiconductor device 101. As shown in FIG. 2 and FIG. 3, the pair of MOSFETs 101m are provided symmetrically with respect to a fourth electrode 14 described later.

As shown in FIG. 1, the semiconductor device 101 is provided with a second electrode 12 and a gate pad 13p on the upper surface of the semiconductor device. The second electrode 12 is, for example, a source electrode and is wider than the gate pad 13p. A termination insulating film 70 is provided on the edge of the upper surface of the semiconductor device 101.

As shown in FIG. 1 and FIG. 3, the semiconductor device 101 is provided with a first electrode 11 on the bottom surface. The first electrode 11 is, for example, a drain electrode and is provided on substantially the entire lower surface of the semiconductor device 101. The semiconductor device 101 has a semiconductor portion 20 between the first electrode 11 and the second electrode 12.

Hereinafter, for the convenience of description, in the specification, the direction from the first electrode 11 toward the second electrode 12 is referred to as an "upward" direction, and the opposite direction is referred to as a "downward" direction, but these notations are for convenience and are independent of the direction of gravity. The upward direction is also referred to as a "direction Z". In addition, as shown in FIG. 1, an arrangement direction of the MOSFET 101m is referred to as a "direction X", and the direction orthogonal to the direction Z and the direction X is referred to as a "direction Y". The length of direction X is also referred to as a "width".

As shown in FIG. 3, the semiconductor portion 20 is provided on the first electrode 11. The semiconductor portion includes a buffer layer 24, a drift layer 21 (first semiconductor layer in the claims), a base layer 22 (second semiconductor layer in the claims), and a source layer 23 (third semiconductor layer in the claims) and includes multiple trenches T1 that open on the upper surface.

The buffer layer 24 is in contact with the first electrode 11. The buffer layer 24 is made of a first conductivity type, for example, an n-type semiconductor.

The drift layer 21 is provided above the first electrode 11, and more specifically, is provided on the buffer layer 24. The drift layer 21 is made of a first conductivity type, for example, an n⁻-type semiconductor. The impurity concentration of the drift layer 21 is, for example, $4 \times 10^{15}$ cm$^{-3}$. It is noted that the "n⁻-type" indicates that a carrier concentration is lower than that of the "n-type", and the "n⁺-type" indicates that a carrier concentration is higher than that of the "n-type". The same applies to the p-type.

As shown in FIG. 3, the base layer 22 is provided on a portion of the drift layer 21 and, more specifically, is provided on a portion of the drift layer 21 constituting a side surface of the trench T1. The base layer 22 is made of a second conductivity type, for example, a p-type semiconductor.

The source layer 23 is provided on at least a portion of the base layer 22 and, more specifically, is provided on a portion of the base layer 22 constituting the side surface of the trench T1. The thickness of the source layer 23, which is the length in the direction Z, is smaller than the thickness of the base layer 22, which is the length in the direction Z. The source layer 23 is in contact with the second electrode 12. The source layer 23 is made of a first conductivity type, for example, an n-type semiconductor.

As shown in FIG. 3, the trench T1 is a hole extending downward in the semiconductor portion 20. The length of the trench T1 in the direction X is, for example, substantially the same as that in the direction Z. The side surface of the trench T1 is mostly configured with the drift layer 21 and is configured with the drift layer 21, the base layer 22, and the source layer 23 aligned along the direction Z. The bottom surface of the trench T1 is configured with the drift layer 21. The multiple trenches T1 are arranged in the direction X.

As shown in FIG. 3, the semiconductor device 101 further includes a contact 30, a third electrode 13, a fourth electrode 14, a first insulating film 41, a second insulating film 42, a third insulating film 43, a fourth insulating film 44, a fifth insulating film 45, and the inter-electrode insulating film 46. In FIG. 3, in order to clearly indicate the boundaries of the first insulating film 41, the second insulating film 42, the third insulating film 43, the fourth insulating film 44, and the fifth insulating film 45, the boundaries are indicated by solid lines, but in an actual semiconductor device, the boundaries may not be clearly observed.

As shown in FIG. 3, the contact 30 is provided on the sides of the source layer 23 and the base layer 22 and is in contact with the side surface of the source layer 23 and the side surface of the base layer 22. In addition, the contact 30 is in contact with the second electrode 12. The contact 30 is, for example, an ohmic contact.

The third electrode 13 is, for example, a gate electrode. The third electrode 13 is provided in, for example, the trench T1 in the semiconductor portion 20. The third electrode 13 is spaced from the semiconductor portion 20 via the first insulating film 41. The third electrode 13 is spaced from the upper portion of the drift layer 21, the base layer 22, and the source layer 23 via the first insulating film 41.

The fourth electrode 14 is, for example, a field plate electrode. The multiple fourth electrodes 14 are arranged in the direction X. The fourth electrode 14 is provided in the trench T1. As shown in FIG. 3, the fourth electrode 14 is provided to extend along the direction Z and has, for example, a uniform width in the direction Z. The fourth electrode 14 is spaced from the drift layer 21 and the third electrode 13. The fourth electrode 14 is connected to the second electrode 12 and has substantially the same potential as the second electrode 12.

The fourth electrode 14 contains, for example, polysilicon, contains at least one of neodymium (Nd), phosphorus (P), boron (B), and arsenic (As) as impurities, and has conductivity. The fourth electrode 14 may contain a metal such as titanium (Ti).

The first insulating film 41 is, for example, a gate insulating film and covers, for example, the surface of the third electrode 13 excluding the upper surface. The first insulating film 41 is provided between the fourth electrode 14 and the third electrode 13 and between the third electrode 13 and the upper portion of the drift layer 21, the base layer 22, and the source layer 23. The first insulating film 41 is in contact with the base layer 22 and the source layer 23. The first insulating film 41 may be in contact with the upper portion of the drift layer 21. The first insulating film 41 contains, for example, silicon (Si) and oxygen (O) and is, for example, silicon oxide (SiO₂).

As shown in FIG. 2 and FIG. 3, the inter-electrode insulating film 46 is provided between the second electrode 12 and the third electrode 13 and between the second electrode 12 and the fourth electrode 14. The inter-electrode insulating film is in contact with the second electrode 12, the third electrode 13, and the fourth electrode 14. The inter-electrode insulating film 46 is in contact with the upper portion of the first insulating film 41. The inter-electrode insulating film 46 is, for example, a silicon oxide film.

The second insulating film 42 is provided in the trench T1. As shown in FIG. 3, the second insulating film 42 is provided on the side surface of the fourth electrode 14. The second insulating film 42 is provided, for example, in substantially the entire area of the fourth electrode 14 except for the upper end of the side surface. A pair of the second insulating films 42 are provided on both side surfaces of one fourth electrode 14. The portion of the second insulating film 42 excluding an upper end portion 42b faces the drift layer 21 via an air gap G1.

As shown in FIG. 3, the thickness of the second insulating film 42, which is the length in the direction X, increases upward in the direction Z. The upper end portion 42b of the second insulating film 42 is in contact with the first insulating film 41. A lower portion 42a of the second insulating film 42 is in contact with the side surface of the fifth insulating film 45, and the lower end is in contact with the end portion of the fourth insulating film 44. The second insulating film 42 contains, for example, silicon and oxygen and is, for example, silicon oxide.

The third insulating film 43 is provided in the trench T1. The third insulating film 43 is provided on the side surface of the trench T1 in substantially the entire area excluding the upper end. As shown in FIG. 3, the third insulating film 43 is provided on the region constituting the side surface of the trench T1 on the surface of the drift layer 21 and is in contact with the drift layer 21. A pair of the third insulating films 43 are provided on both sides of one fourth electrode 14.

The third insulating film 43 faces the second insulating film 42 via the air gap G1. The third insulating film 43 is in contact with the air gap G1. The thickness of the third insulating film 43, which is the length in the direction X, increases upward.

As shown in FIG. 3, an upper end portion 43b of the third insulating film 43 is in contact with the first insulating film 41 and is in contact with the upper end portion 42b of the second insulating film 42. A lower end portion 43a of the third insulating film 43 is in contact with the end portion of the fourth insulating film 44. The third insulating film 43 contains, for example, silicon and oxygen and is, for example, silicon oxide.

The fourth insulating film 44 is provided in the trench T1. The pair of fourth insulating films 44 are provided in the corners of the bottom surface of the trench T1. The fourth insulating film 44 is provided on the region constituting the bottom surface of the trench T1 on the surface of the drift layer 21 and is in contact with the drift layer 21. The fourth insulating film 44 is provided between the second insulating film 42 and the third insulating film 43 and is in contact with the air gap G1. The length in the direction Z, which is the thickness of the fourth insulating film 44, is substantially uniform. The fourth insulating film 44 contains, for example, silicon and oxygen and is, for example, silicon oxide.

The fifth insulating film 45 is provided in the trench T1. As shown in FIG. 3, the fifth insulating film 45 is provided substantially in the center of the bottom surface of the trench T1. The fifth insulating film 45 is provided on the region constituting the bottom surface of the trench T1 on the surface of the drift layer 21 and is in contact with the drift layer 21. The fifth insulating film 45 is provided between the drift layer 21 and the lower surface of the fourth electrode 14. The width of the fifth insulating film 45 is the same as the width of the lower surface of the fourth electrode 14. The side surface of the fifth insulating film 45 is in contact with the end portion of the fourth insulating film 44.

In addition, the length in the direction Z, which is the thickness of the fifth insulating film 45, is larger than the thickness of the fourth insulating film 44 and is larger than the width of the lower surface of the air gap G1. Accordingly, the electric field strength in the vicinity of the lower surface of the fourth electrode 14, which tends to have a high electric field strength, is reduced. The fifth insulating film 45 contains, for example, silicon and oxygen and is, for example, silicon oxide.

The relative permittivity of the second insulating film 42, the third insulating film 43, the fourth insulating film 44, and the fifth insulating film 45 is, for example, 3.0 to 3.9.

The fourth electrode 14 is spaced from the third electrode 13, the drift layer 21, the base layer 22, and the source layer 23 to be insulated due to the second insulating film 42, the third insulating film 43, the fourth insulating film 44, the fifth insulating film 45, and the air gap G1.

The air gap G1 is a space provided in the trench T1 and is a space between the second insulating film 42 and the third insulating film 43. The air gap G1 is filled with, for example, air. The width of the air gap G1 decreases toward the direction Z. As shown in FIG. 3, the cross-sectional shape of the air gap G1 is a substantially isosceles triangle, the two equilateral sides are in contact with the second insulating film 42 and the third insulating film 43, and the base is in contact with the fourth insulating film 44.

The lower surface of the air gap G1 is located below the lower surface of the fourth electrode 14. The upper end of the air gap G1 is located below the upper surface of the fourth electrode 14. The relative permittivity of the air gap G1 is about 1.0, which is lower than the relative permittivity of the second insulating film 42 and the third insulating film 43.

The cross-sectional shape of the air gap G1 may be a substantially triangular shape with vertices and sides deformed. In addition, the cross-sectional shape of the air gap G1 is not limited to a substantially triangular shape and may be, for example, a substantially trapezoidal shape as long as the width on the lower surface side decreases upward.

When the air gap G1 has a substantially trapezoidal shape, the upper end portion 43b of the third insulating film 43 and the upper end portion 42b of the second insulating film 42 are not in contact with each other, but both are in contact with the first insulating film 41. In this case, the upper end of the air gap G1 is interposed between the upper end portion 42b of the second insulating film 42 and the upper end portion 43b of the third insulating film 43.

The operations of the semiconductor device 101 according to the embodiment will be described below.

When the semiconductor device 101 is turned off, for example, a potential of 0 V from a power supply device is applied to the second electrode 12, and for example, a positive potential from the power supply device is applied to the first electrode 11. At this time, a depletion layer extends from the side surface of the trench T1 to the drift layer 21 due to the fourth electrode 14 which is the source potential.

Since the depletion layer is stretched substantially in parallel to the side surface of the trench T1 by adjusting the electric capacitance between the fourth electrode 14 and the side surface of the trench T1, the breakdown voltage of the semiconductor device 101 is improved. The electric capacitance is adjusted by the second insulating film 42 and the third insulating film 43 disposed between the fourth electrode 14 and the side surface of the trench T1, and specifically, the total value of the thickness of the second insulating film 42 and the thickness of the third insulating film 43 are adjusted so as to increase on the upper surface side and decrease toward the lower side. Accordingly, the electric capacitance between the fourth electrode 14 and the drift layer 21 is large on the upper surface side where the potential is low and decreases toward the bottom surface side where the potential is high.

In addition, in the semiconductor device 101, the second insulating film 42 and the third insulating film 43 are disposed between the fourth electrode 14 and the side surface of the trench T1 to increase the electric field strength of the drift layer 21. Since the integrated value of the electric field strength becomes, for example, a breakdown voltage, the breakdown voltage of the semiconductor device 101 is improved. In addition, since the total value of the thickness of the second insulating film 42 and the thickness of the third insulating film 43 changes continuously in the vertical direction, the electric field strength of the drift layer 21 constituting the side surface of the trench T1 also continuously changes, and the breakdown voltage is further improved.

As described above, since the breakdown voltage of the semiconductor device 101 is improved, even if the impurity concentration of the drift layer 21 is set high in order to reduce the on-resistance, a voltage breakdown property becomes good. In addition, since the semiconductor device 101 insulates the fourth electrode 14 by using the air gap G1, the width of the MOSFET 101m can be allowed to be reduced in comparison with a case where the air gap G1 is not provided, and the number of MOSFETs 101m provided in the semiconductor device 101 can be allowed to be increased. As a result, the on-resistance can be reduced.

The method for manufacturing the semiconductor device 101 according to the embodiment will be described below.

Figure 4A:
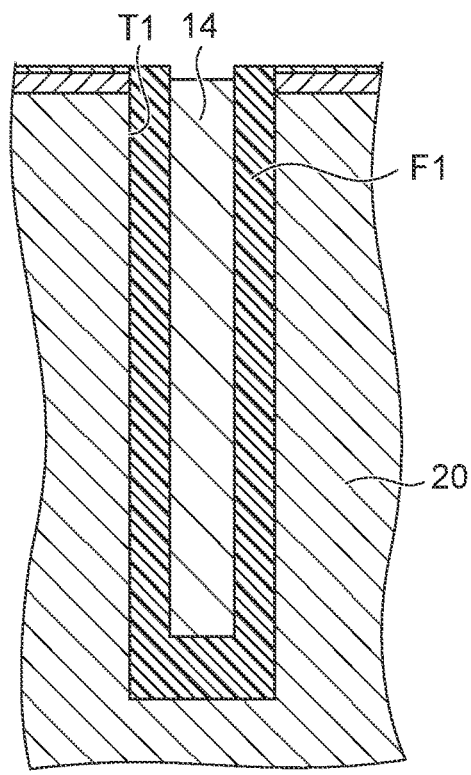
FIGS. 4A, 4B, and 5 are schematic views showing a method for manufacturing the semiconductor device according to the first embodiment.
Figure 4B:
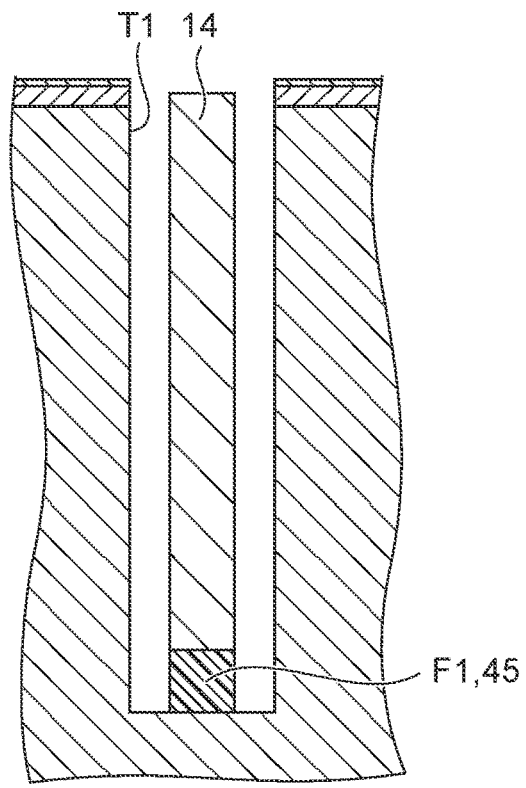
Figure 5:
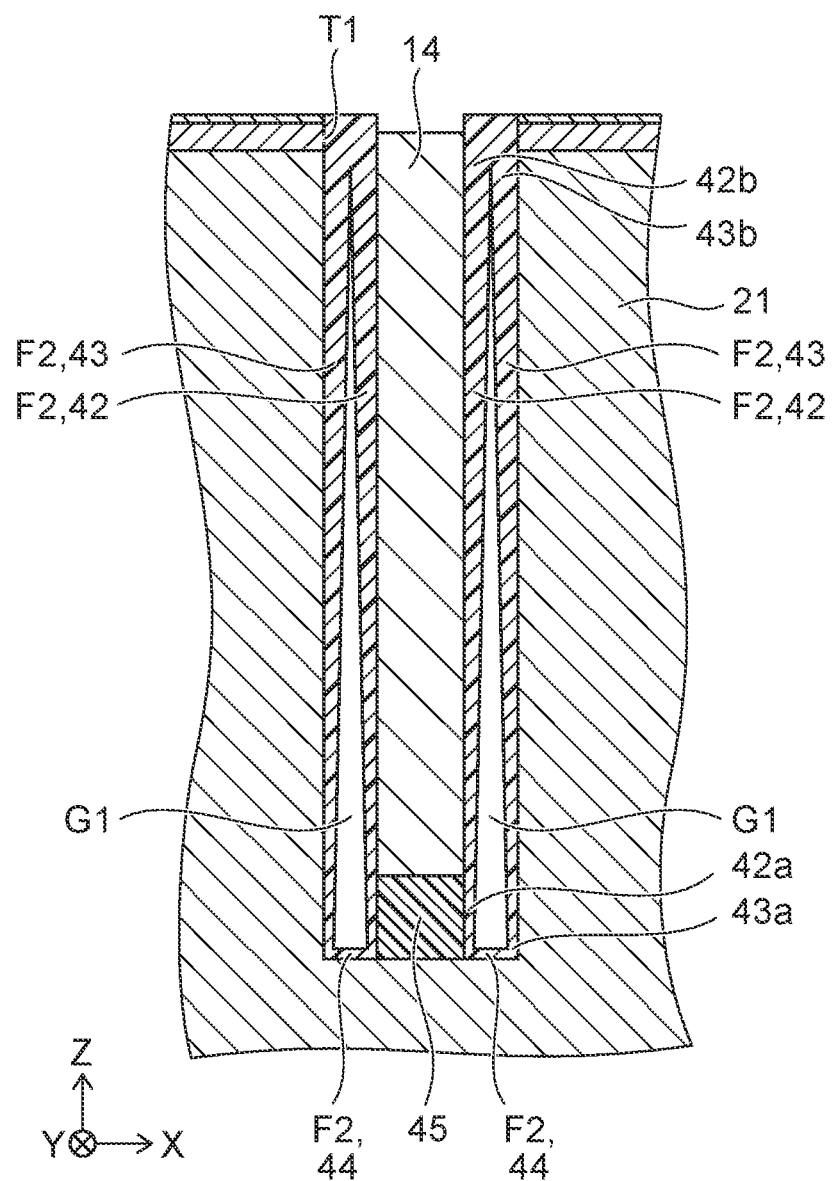

FIGS. 4A, 4B, and 5 are schematic views showing the method for manufacturing the semiconductor device according to the embodiment.

As shown in FIG. 4A, the trench T1 is formed in the semiconductor portion 20, an insulating film F1 is formed on the inner surface of the trench T1, and the fourth electrode 14 is formed on the inner surface of the insulating film F1.

The insulating film F1 is, for example, a silicon oxide film.

The fourth electrode 14 is made of, for example, a metal or polysilicon added with impurities.

As shown in FIG. 4B, the fifth insulating film 45 is formed by removing the insulating films F1 located on both sides of the fourth electrode 14 by, for example, reactive ion etching (RIE) or wet etching.

The fifth insulating film 45 is the insulating film F1 remaining between the lower surface of the fourth electrode 14 and the bottom surface of the trench T1. Spaces are formed on both sides of the fourth electrode 14 and the fifth insulating film 45.

As shown in FIG. 5, insulating films F2 are formed in the spaces on both sides of the fourth electrode 14 and the fifth insulating film 45. The insulating film F2 is, for example, a silicon oxide film. The insulating film F2 is formed by low-pressure chemical vapor deposition (LPCVD) under a predetermined condition. Accordingly, the insulating film F2 is formed on the side surface and the bottom surface of the trench T1, the side surface of the fifth insulating film 45, and the side surface of the fourth electrode 14. The predetermined condition is, for example, to allow the gas to reach the bottom of the space shown in FIG. 4B and to allow a deposition rate at the bottom of the space to be smaller than the deposition rate at the top of the space by setting the gas pressure and to increase the deposition rate by setting the temperature.

As shown in FIG. 5, the insulating film F2 is formed to be thicker from the bottom of the space upward, and for example, to close the upper portion of the trench T1. The insulating film F2 is the second insulating film 42, the third insulating film 43, and the fourth insulating film 44. As described above, the second insulating film 42, the third insulating film 43, and the fourth insulating film 44 are formed in a state of being in contact with each other.

The effects of the semiconductor device 101 according to the embodiment will be described below.

With the semiconductor device 101 according to the embodiment, by disposing the air gap G1 having a low relative permittivity between the side surface of the fourth electrode 14 and the region constituting the side surface of the trench T1 on the surface of the drift layer 21, the width of the MOSFET 101m can be reduced, and the conduction path of the semiconductor device 101 can be increased. As a result, the on-resistance can be reduced.

In addition, with the semiconductor device 101 according to the embodiment, by providing the second insulating film 42, the third insulating film 43, and the air gap G1 of which width in the lower side decreases upward between the side surface of the fourth electrode 14 and the regions constituting the side surface of the trench T1 on the surface of the drift layer 21, the breakdown voltage can be improved. Since the breakdown voltage is improved, even if the impurity concentration of the drift layer 21 is set to be high in order to reduce the on-resistance, a voltage breakdown property can be improved.

When the second insulating film 42 and the third insulating film 43 are not provided on the side surface of the fourth electrode 14 as in the embodiment, specifically, in a semiconductor device in which only air gap is disposed between the side surface of the fourth electrode 14 and the region constituting the side surface of the trench T1 on the surface of the drift layer 21, for example, in the case of setting a voltage of 340 V or less being applied, the impurity concentration of the drift layer is about $3 \times 10^{15}$ cm$^{-3}$, and the on-resistance is about 1250 mΩ·mm$^2$. On the other hand, in the semiconductor device according to the embodiment in the same settings, the impurity concentration of the drift layer 21 can be set to, for example, about $5 \times 10^{15}$ cm$^{-3}$, and the on-resistance is, for example, about 720 mΩ mm$^2$.

As described above, with the semiconductor device 101 according to the embodiment, the breakdown voltage can be improved, and the amount of current can be improved.

In addition, with the semiconductor device 101 according to the embodiment, the generation of stress in the semiconductor portion 20 can be suppressed by disposing the air gap G1 between the second insulating film 42 and the third insulating film 43. In addition, the manufacturing process for the second insulating film 42, the third insulating film 43, and the fourth insulating film 44 is easier than burying the inside of the trench T1 with the insulating film without providing air gaps.

Second Embodiment

In a semiconductor device 102 according to the embodiment, a fourth electrode 14A is made of polysilicon with an impurity concentration gradient set, and the cross-sectional shape of the air gap G1 is a substantially right-angled triangle.

Figure 6:
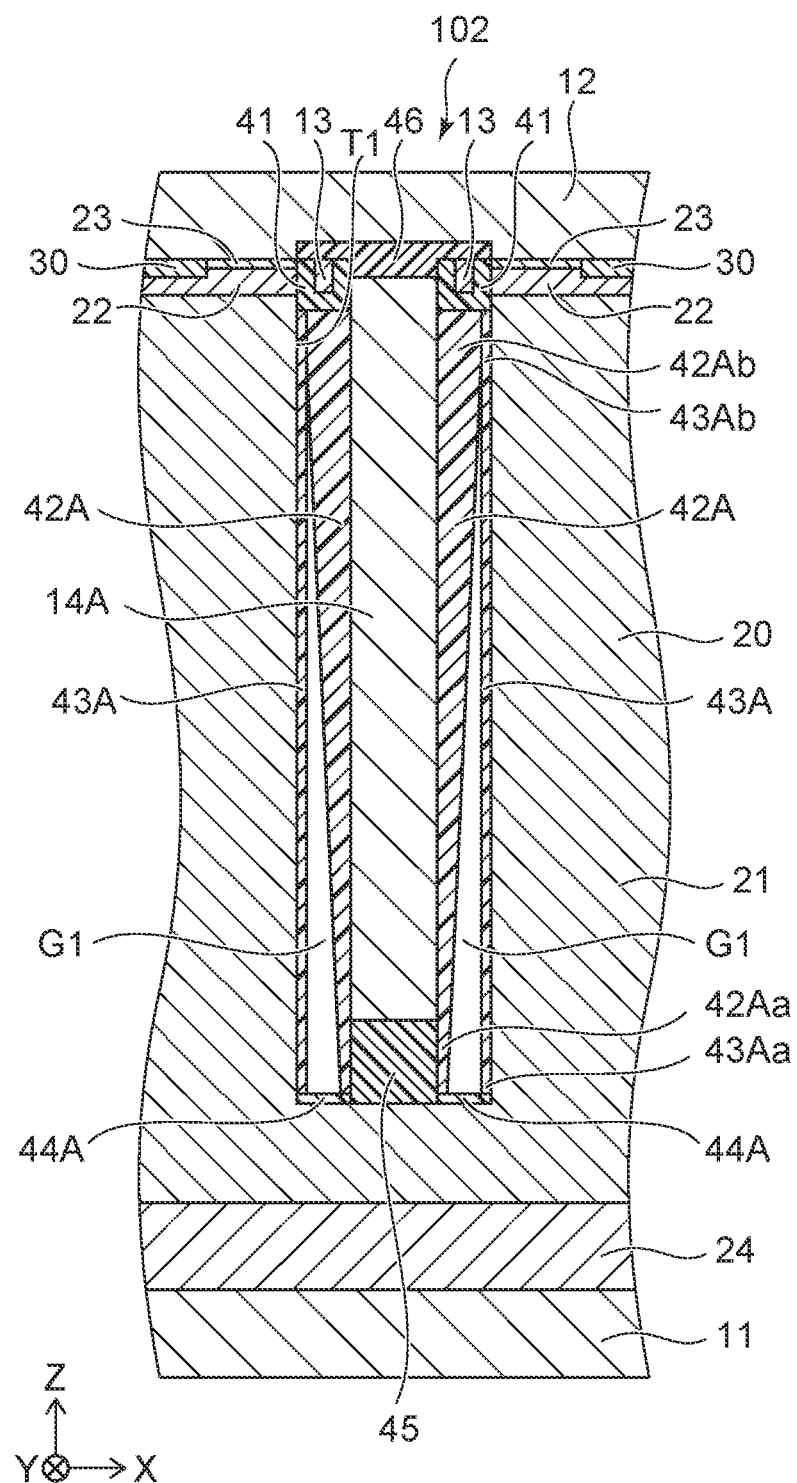
FIG. 6 is an enlarged cross-sectional view showing a semiconductor device according to a second embodiment.

FIG. 6 is an enlarged cross-sectional view showing the semiconductor device according to the embodiment.

The fourth electrode 14A contains at least one of neodymium (Nd), phosphorus (P), boron (B), and arsenic (As) as impurities, and the impurity concentration is high in the upper portion and decreases downward. The impurity concentration of the fourth electrode 14A continuously increases from the lower portion toward the direction Z.

The thickness of a second insulating film 42A increases upward from a lower portion 42Aa. Specifically, the thickness of the second insulating film 42A in the lower portion 42Aa is substantially uniform, and the thickness of the portion above the lower portion 42Aa increases upward. An upper end portion 42Ab of the second insulating film 42A is in contact with an upper end portion 43Ab of a third insulating film 43A.

The thickness of the third insulating film 43A is substantially uniform. The thickness of a fourth insulating film 44A is substantially the same as the thickness of the third insulating film 43A.

Also in the semiconductor device 102 according to the embodiment, the total value of the thickness of the second insulating film 42A and the thickness of the third insulating film 43A is large on the upper surface side and decreases downward. The width of the air gap G1 is narrow in the lower portion and decreases upward.

Hereinafter, a method for manufacturing the semiconductor device 102 according to the embodiment will be described.

Figure 7:
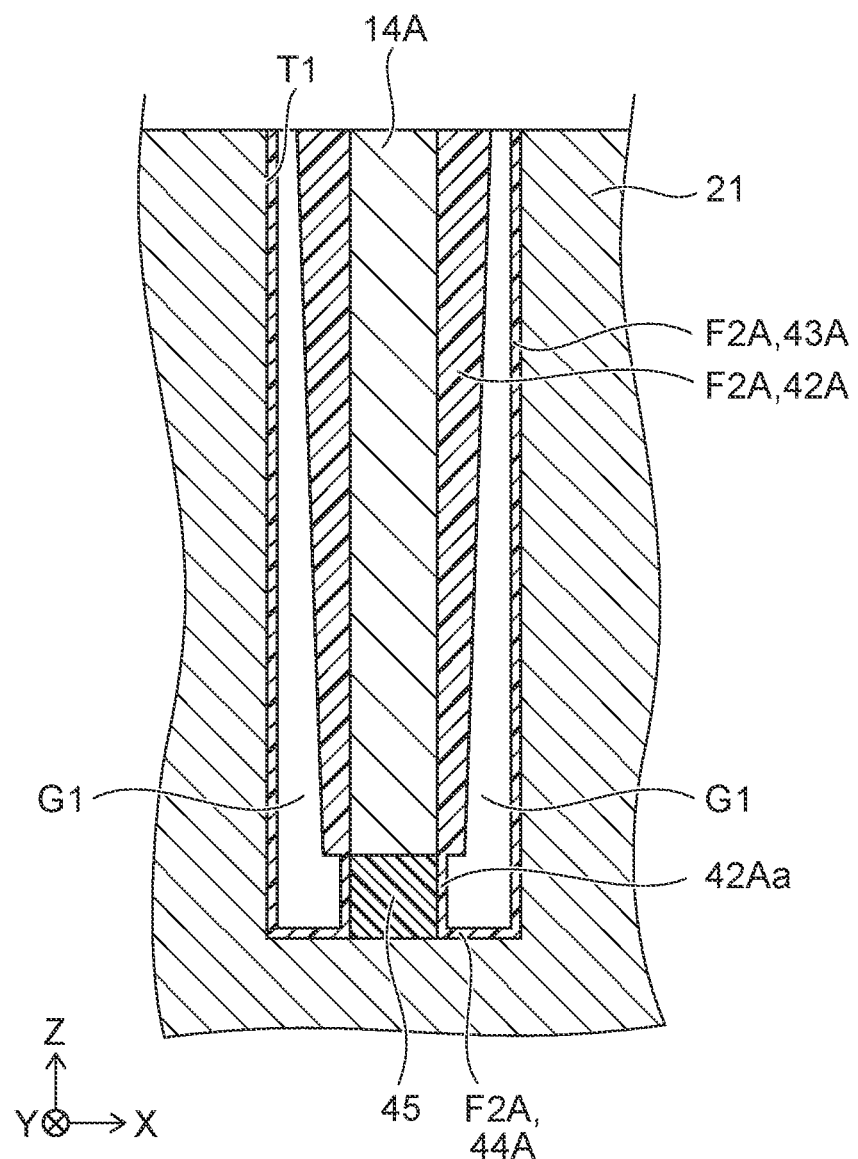
FIG. 7 is a schematic view showing a method for manufacturing the semiconductor device according to the second embodiment.

FIG. 7 is a schematic view showing the method for manufacturing the semiconductor device 102 according to the embodiment.

The fourth electrode 14A of the embodiment is formed by forming polysilicon that does not contain impurities on the inner surface and the upper surface of the insulating films formed on the side surface and the bottom surface of the trench T1, disposing a film containing, for example, high-concentration impurities on the upper surface of the polysilicon, and thermally diffusing the impurities into the polysilicon, and after that, removing the polysilicon other than the inside of the trench. Accordingly, the impurity concentration of the fourth electrode 14A is high in the upper portion and continuously decreases toward the lower portion.

Next, spaces are formed on both sides of the fourth electrode 14A and the fifth insulating film 45 by removing the insulating films on both sides of the fourth electrode 14A, and as shown in FIG. 7, an insulating film F2A is formed in the spaces by thermally oxidizing. The insulating film F2A is a silicon oxide film. The deposition rate of the silicon oxide film due to the thermal oxidation increases as the impurity concentration increases. The deposition rate of the thermal oxidation in the fifth insulating film 45 is, for example, lower than the deposition rate of the thermal oxidation in the lower portion of the fourth electrode 14A. Therefore, the thickness of the second insulating film 42A in the fourth electrode 14A continuously increases from the lower portion to the upper portion of the fourth electrode 14A. The thickness of the second insulating film 42A in the lower portion 42Aa is substantially uniform and is, for example, smaller than the thickness of the second insulating film 42A at the fourth electrode 14A.

According to the semiconductor device 102 in the embodiment, similarly to the first embodiment, the breakdown voltage can be improved, and the amount of current can be improved.

The configurations, operations, and effects other than the above in the embodiment are the same as those in the first embodiment.

Variation of Second Embodiment

The fourth electrode 14A in the variation is made of polysilicon of which impurity concentration is set in, for example, three stages, and the cross-sectional shape of the air gap G1 is a substantially right-angled triangle.

Figure 8:
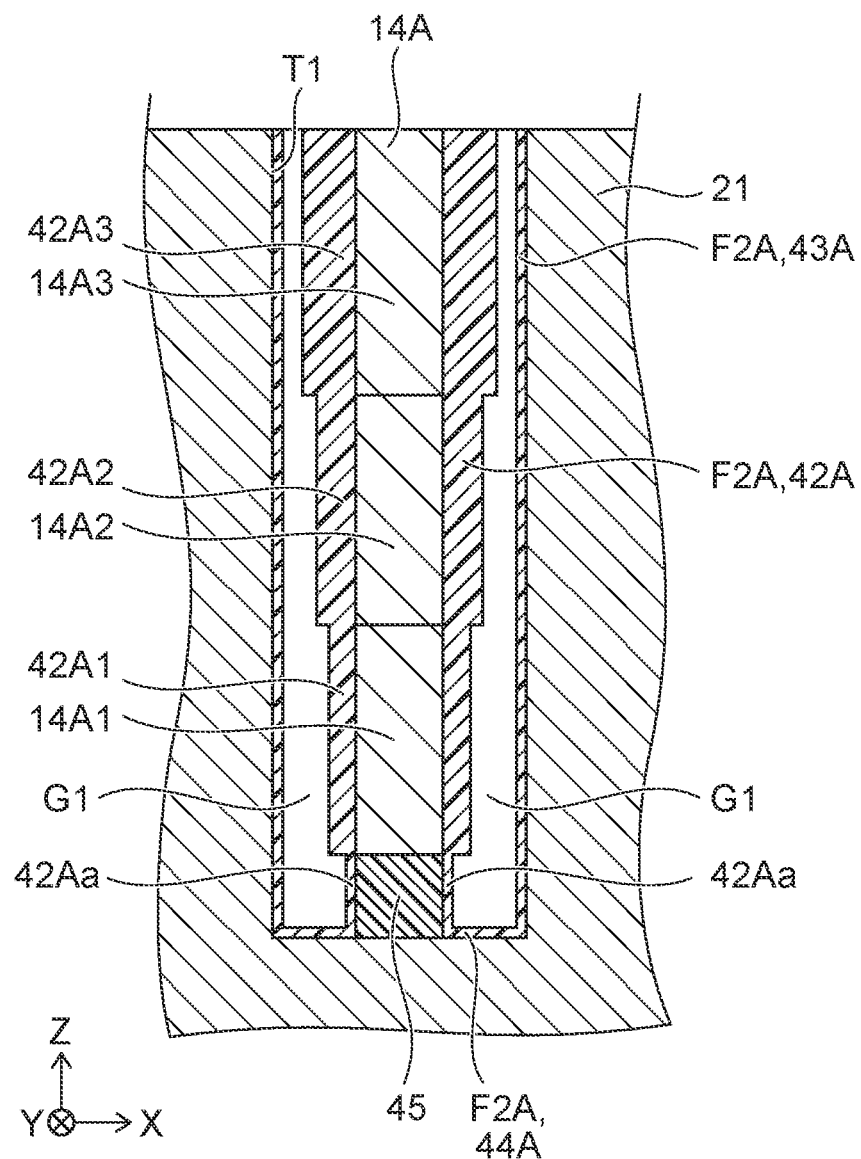
FIG. 8 is a schematic view showing a method for manufacturing a semiconductor device according to a variation of the second embodiment.

FIG. 8 is a schematic view showing a method for manufacturing a semiconductor device according to the variation.

As shown in FIG. 8, the fourth electrode 14A in the variation includes a lower portion 14A1, an intermediate portion 14A2, and an upper portion 14A3. The impurity concentration in the intermediate portion 14A2 is higher than the impurity concentration in the lower portion 14A1 and is lower than the impurity concentration in the upper portion 14A3. As described above, the impurity concentration of the fourth electrode 14A increases toward the direction Z. The fourth electrode 14A contains at least one of neodymium (Nd), phosphorus (P), boron (B), and arsenic (As) as impurities.

The fourth electrode 14A in the embodiment is formed by depositing polysilicon containing low-concentration impurities, polysilicon containing medium-concentration impurities, and polysilicon containing high-concentration impurities.

As shown in FIG. 8, similarly to the second embodiment, the insulating film F2A provided in the spaces on both sides of the fourth electrode 14A and the fifth insulating film 45 is, for example, a silicon oxide film and is formed by, for example, thermal oxidation. Accordingly, the deposition rate of the fourth electrode 14A in the intermediate portion 14A2 is lower than the deposition rate in the upper portion 14A3 and is higher than the deposition rate in the lower portion 14A1. In addition, the deposition rate of the insulating film F2A in the drift layer 21 and the deposition rate in the fifth insulating film 45 are, for example, lower than the deposition rate in the fourth electrode 14A.

Accordingly, the thickness of the insulating film F2A on the side surface of the fourth electrode 14A is large in the upper portion and gradually decreases downward. Therefore, the thickness of the second insulating film 42A is also large in an upper portion 42A3 and gradually decreases downward. As shown in FIG. 8, the second insulating film 42A has a thickness of, for example, four stages in the lower portion 42Aa, an intermediate lower portion 42A1, an intermediate upper portion 42A2, and the upper portion 42A3. The thickness of the second insulating film 42A in the intermediate upper portion 42A2 is larger than the thickness in the intermediate lower portion 42A1 and is smaller than the thickness in the upper portion 42A3. The thickness of the second insulating film 42A in the lower portion 42Aa which is in contact with the side surface of the fifth insulating film 45 is smaller than the thickness in the intermediate lower portion 42A1.

As shown in FIG. 8, the width of the air gap G1 is large in the lower portion and decreases upward. The cross-sectional shape of the air gap G1 is a substantially right-angled triangle, but the cross-sectional shape of the air gap G1 includes multiple step differences on the hypotenuse which is in contact with the second insulating film 42A and the fifth insulating film 45.

According to the semiconductor device in the embodiment, similarly to the first embodiment, the amount of current can be improved, and the breakdown voltage can be improved.

The configurations, operations, and effects other than the above in the embodiment are the same as those in the first embodiment.

According to the embodiment of the invention, it is possible to provide a semiconductor device capable of improving reliability.

Heretofore, the embodiments of the invention have been described above with reference to specific examples. However, the embodiments of the invention are not limited to these specific examples. For example, specific configurations, materials, and the like of semiconductor portions, multiple electrodes, and insulating films in a MOSFET included in a semiconductor device are included in the scope of the invention as long as the invention is similarly carried out by appropriately selecting from a range known to those skilled in the art and the same effect can be obtained. A combination of any two or more elements of the specific example to the technically possible extent is also included in the scope of the invention as long as the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a semiconductor portion provided on the first electrode and including:
   a first semiconductor layer of a first conductivity type provided on the first electrode;
   a second semiconductor layer of a second conductivity type provided on a portion of the first semiconductor layer; and
   a third semiconductor layer of a first conductivity type provided on at least a portion of the second semiconductor layer;
a second electrode in contact with the third semiconductor layer;
a third electrode spaced from the second semiconductor layer, the third semiconductor layer, and the second electrode;
a first insulating film covering the third electrode and being in contact with the second semiconductor layer and the third semiconductor layer;
a fourth electrode extending in a first direction from the first electrode toward the second electrode, connected to the second electrode, and spaced from the first semiconductor layer and the third electrode; and
a second insulating film provided on a side surface of the fourth electrode, facing the first semiconductor layer through an air gap, and increasing in thickness toward the first direction.

2. The device according to claim 1, further comprising a third insulating film in contact with the first semiconductor layer and facing the second insulating film through the air gap,
the third insulating film being substantially uniform in thickness.

3. The device according to claim 2, further comprising a fourth insulating film in contact with the first semiconductor layer and the air gap between the second insulating film and the third insulating film.

4. The device according to claim 1, further comprising a third insulating film in contact with the first semiconductor layer and facing the second insulating film through the air gap,
the third insulating film increasing in thickness toward the first direction.

5. The device according to claim 4, further comprising a fourth insulating film in contact with the first semiconductor layer and the air gap between the second insulating film and the third insulating film.

6. The device according to claim 1, further comprising a fifth insulating film provided between a lower surface of the fourth electrode and the first semiconductor layer.

7. The device according to claim 6, wherein the second insulating film has a lower portion in contact with the fifth insulating film.

8. The device according to claim 1, wherein the fourth electrode is made of polysilicon containing at least one of neodymium, phosphorus, boron, and arsenic as impurities, and a concentration of the impurity increases toward the first direction.

* * * * *